United States Patent
Mark et al.

(10) Patent No.: US 7,145,344 B2
(45) Date of Patent: Dec. 5, 2006

(54) METHOD AND CIRCUITS FOR LOCALIZING DEFECTIVE INTERCONNECT RESOURCES IN PROGRAMMABLE LOGIC DEVICES

(75) Inventors: David Mark, San Jose, CA (US); Yuezhen Fan, San Jose, CA (US); Zhi-Min Ling, Cupertino, CA (US); Xiao-Yu Li, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 512 days.

(21) Appl. No.: 10/703,326

(22) Filed: Nov. 7, 2003

(65) Prior Publication Data
US 2004/0103354 A1    May 27, 2004

Related U.S. Application Data

(63) Continuation-in-part of application No. 10/280,611, filed on Oct. 25, 2002, now Pat. No. 6,889,368.

(51) Int. Cl.
*G01R 31/08* (2006.01)
*G01R 31/04* (2006.01)

(52) U.S. Cl. .................... 324/525; 324/527; 324/538

(58) Field of Classification Search ............... 324/525, 324/527, 538; 714/725; 716/16, 17, 4
See application file for complete search history.

(56) References Cited

U.S. PATENT DOCUMENTS

| | | | |
|---|---|---|---|
| 5,790,479 A | 8/1998 | Conn | |
| 5,963,046 A | 10/1999 | Konuk | |
| 5,976,898 A | 11/1999 | Marty et al. | |
| 5,982,683 A * | 11/1999 | Watson et al. | 365/201 |
| 6,005,829 A | 12/1999 | Conn | |
| 6,069,849 A | 5/2000 | Kingsley et al. | |
| 6,075,418 A | 6/2000 | Kingsley et al. | |
| 6,122,209 A | 9/2000 | Pass et al. | |
| 6,144,262 A | 11/2000 | Kingsley | |
| 6,157,210 A * | 12/2000 | Zaveri et al. | 365/201 |
| 6,219,305 B1 | 4/2001 | Patrie et al. | |
| 6,232,845 B1 | 5/2001 | Kingsley et al. | |
| 6,233,205 B1 | 5/2001 | Wells et al. | |
| 6,278,291 B1 | 8/2001 | McClintock et al. | |
| 6,425,077 B1 | 7/2002 | Le et al. | |
| 6,452,459 B1 | 9/2002 | Chan et al. | |
| 6,466,520 B1 | 10/2002 | Speyer et al. | |
| 6,509,739 B1 | 1/2003 | Voogel et al. | |
| 6,530,071 B1 | 3/2003 | Guccione et al. | |
| 6,536,007 B1 | 3/2003 | Venkataraman | |
| 6,570,181 B1 | 5/2003 | Graas et al. | |
| 6,574,761 B1 | 6/2003 | Abramovici et al. | |
| 6,691,267 B1 * | 2/2004 | Nguyen et al. | 714/725 |
| 6,775,817 B1 * | 8/2004 | Ono et al. | 716/21 |
| 6,817,006 B1 * | 11/2004 | Wells et al. | 716/16 |

* cited by examiner

Primary Examiner—Andrew H. Hirshfeld
Assistant Examiner—Timothy J. Dole
(74) Attorney, Agent, or Firm—Arthur J. Behiel; Justin Liu

(57) ABSTRACT

Described are methods and circuits for identifying defective device layers and localizing defects. Production PLD tests extract statistically significant data relating failed interconnect resources to the associated conductive metal layer. Failure data thus collected is then analyzed periodically to identify layer-specific problems. Test circuits in accordance with some embodiments employ interconnect resources heavily weighted in favor of specific conductive layers to provide improved layer-specific failure data. Some such test circuits are designed to identify open defects, while others are designed to identify short defects.

12 Claims, 5 Drawing Sheets

METHOD AND CIRCUITS FOR LOCALIZING DEFECTIVE INTERCONNECT RESOURCES IN PROGRAMMABLE LOGIC DEVICES

BACKGROUND

Most semiconductor devices are built up using a number of material layers. Each layer is patterned to add or remove selected portions to form circuit features that will eventually make up a complete integrated circuit. The patterning process, known as photolithography, defines the dimensions of the circuit features.

Modern semiconductor devices have a great many layers formed using very complex sequences of process steps. Process problems in the formation of any one layer can render an entire device defective. Defective devices are therefore tested to physically locate defects, in part to identify the defective layer. Identifying defective layers helps to troubleshoot device processes in an effort to increase device yield and prevent repeat failures.

One class of semiconductor devices, collectively known as programmable logic devices (PLDs), includes complex devices with extensive routing resources. The routing resources are typically collections of parallel metal lines formed using overlapping and isolated metal layers. The metal lines in a given layer are minimally spaced to reduce their impact on device area, and are consequently susceptible to so-called "bridge" defects that join adjacent wire conductors. These conductors are also exceptionally small in cross section, and are consequently susceptible to opens, points along a given connector that are undesirably electrically disconnected.

Opens, bridging defects, and other defects result from process problems associated with the metal layer in which the defective resource is formed. It is therefore important, in troubleshooting processes that lead to defective devices, to isolate a given defect to the layer in which that defect was formed. Unfortunately, the process of locating a defect from among the myriad resources on a modern integrated circuit is complex and difficult, and typically includes stripping a device, layer-by-layer, in an attempt to visually locate a defect identified using some conventional test pattern. There is therefore a need for improved methods of identifying defective device layers and localizing defects.

SUMMARY

The present invention addresses the needs for improved methods and circuits for identifying defective device layers and localizing defects. In accordance with one embodiment, production PLD tests extract statistically significant data relating failed interconnect resources to the associated conductive metal layer. Failure data thus collected is then analyzed periodically to identify layer-specific problems. Identifying troublesome layers helps manufacturing engineers improve layer-specific processes, and consequently facilitates yield improvement.

Test circuits include components in more than one device layer, and may fail due to defects in any of those components. The mere fact of a test circuit's failure is therefore not necessarily indicative of the layer in which a defect occurs. It can be difficult, therefore, to develop a valid statistical model for identifying defects associated with specific layers. Test circuits in accordance with some embodiments employ interconnect resources heavily weighted in favor of specific conductive layers to provide improved layer-specific failure data. Some such test circuits are designed to identify open defects, while others are designed to identify short defects.

This summary does not limit the invention, which is instead defined by the claims.

DETAILED DESCRIPTION

Figure 1:
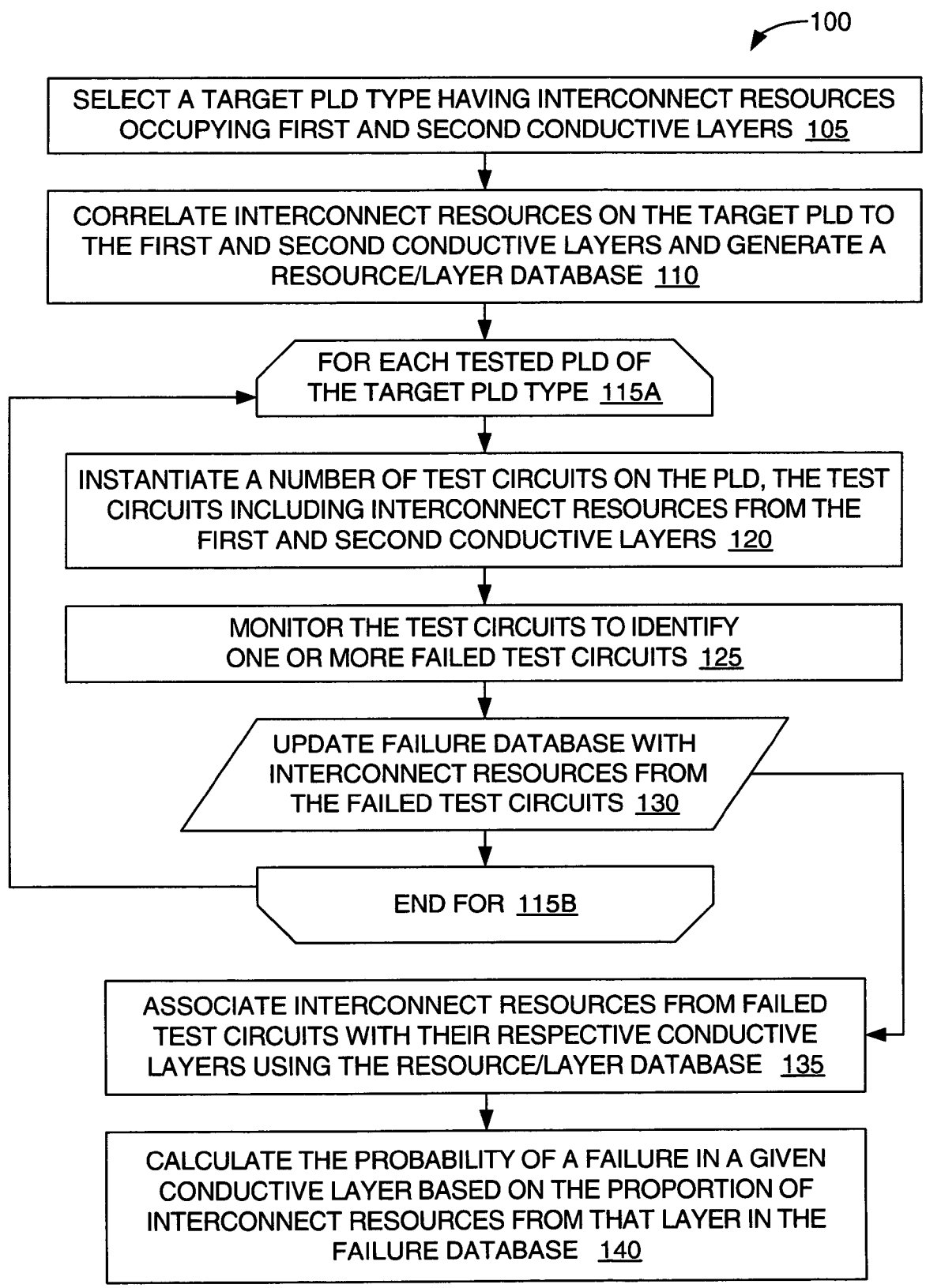
FIG. 1 depicts a flowchart 100 showing a method, in accordance with one embodiment, of analyzing programmable logic devices (PLDs) to develop statistical failure models for failing layers.

FIG. 1 depicts a flowchart 100 showing a method, in accordance with one embodiment, of analyzing programmable logic devices (PLDs) to develop statistical failure models for failing layers. In step 105, the exemplary method of FIG. 1 is applied to a type of PLD assumed to include first and second conductive metal layers: conventional PLDs typically include many more.

During the PLD design process, a mask sequence is generated from a design database describing the intended PLD-circuit functionality. Next, layout designers employ sophisticated computer-aided design systems to translate the design database into a composite picture, or "composite," detailing the various layers for fabrication. The constituent layers of the composite are then used to create masks for defining the various layers. In step 110, the design database is back-annotated with data from the composite to correlate each interconnect resource on the target PLD with the corresponding metal layer. The resulting "resource/layer" database can then be used to associate a failed resource with the corresponding failed conductive layer. For example, the resource/layer database might identify a first collection of interconnect lines as extending in the first metal layer and a second collection of interconnect lines as extending in the second metal layer. A failure of one interconnect line in the first collection is therefore indicative of a failure in the first metal layer, whereas a failure of one of the second collection of interconnect lines is indicative of a failure in the second metal layer. The following Table 1 illustrates a number of entries in a hypothetical resource/layer database for a simplified, exemplary PLD type having a first metal layer that includes "single" interconnect lines that extend between adjacent logic blocks, a second metal layer that includes "double" interconnect lines that extend from one logic block past an adjacent logic block, a third metal layer that includes "hex" lines that extend along six logic blocks, and a fourth metal layer that includes "long" lines that extend across the breadth of the PLD type.

TABLE 1

| METAL LAYER | SINGLE | DOUBLE | HEX | LONG |
| --- | --- | --- | --- | --- |
| 1 | X | | | |
| 2 | | X | | |

TABLE 1-continued

| METAL LAYER | SINGLE | DOUBLE | HEX | LONG |
|---|---|---|---|---|
| 3 | | | X | |
| 4 | | | | X |

Steps 105 and 110 are only carried out once on the design database of the type of PLD to be tested. Test processes described in connection with the remaining steps of flowchart 100 are then repeated on many PLDs of that type. Failure data thus collected can then be analyzed periodically to identify layer-specific problems. Identifying troublesome layers helps manufacturing engineers focus on problem layers and consequently facilitates yield improvement.

Blocks 115A and 115B, the respective ends of an illustrative "for loop," bound the next series of steps. This loop is repeated for each of many PLDs under test. First, in step 120, one or more test circuits are instantiated on a PLD under test and activated. Suitable test circuits are described, for example, in U.S. Pat. No. 6,005,829 to Conn, which issued Dec. 21, 1999, and U.S. Pat. No. 6,069,849 to Kingsley et al., which issued May 30, 2000. Both the Conn and Kingsley patents are incorporated herein by reference. The active test circuits are then monitored for failure (step 125). The resulting test data is then used to update a failure database (step 130) to maintain a record of the resources associated with failed test circuits. In one embodiment, the failure database records just the interconnect resources used in failed test circuits. Other embodiments might list other features of failed test circuits, such as the constituent logic or input/output blocks. The failure database can describe elements of failed test circuits using conventional netlist designations or other suitable designations. The following Table 2 illustrates a number of entries in a hypothetical failure database.

TABLE 2

| TEST CKT | USED | FAILED | SINGLE | DOUBLE | HEX | LONG |
|---|---|---|---|---|---|---|
| 1 | 50,280 | 8 | 12 | 0 | 48 | 0 |
| 2 | 100,560 | 2 | 24 | 96 | 0 | 0 |

Steps 120 through 130 are repeated many times. Assuming a reasonably reliable fabrication process for the PLDs monitored using these steps, the majority of test PLDs will not produce failed test circuits, so the tests applied to most PLDs will not generate test data for inclusion in the failure database of step 130. Over time, however, the failure database will collect substantial failure data from many PLDs tested. This data can then be analyzed for anomalous statistical variations regarding one or more layer-specific resources.

In step 135, the resource/layer database exemplified in Table 1 is applied to the failure database exemplified in Table 2 to correlate failed circuits with their constituent layers. In the simple example of Table 2, for example, test circuit number 1 exhibited eight failures in about fifty thousand instantiations, whereas test circuit number 2 exhibited two failures in over one hundred thousand instantiations. In this simple example, the test circuit heavily populated with hex lines is significantly more likely to fail than the test circuit populated with double lines. From Table 1, the hex lines are in metal layer three and the double lines are in metal layer two. The failure mechanism is therefore likely related to metal layer three. (Both test circuits include a similar proportion of single lines, so the different failure rates are not likely a result of failures in metal layer one.)

The example of Tables 1 and 2 are extremely simple for ease of illustration. In practice, many test circuits of various types can be instantiated on thousands of PLDs during production testing. The failure database can then be periodically analyzed, using well-known statistical and probabilistic methods, to look for patterns indicative of failures in specific layers (step 140). These findings can then be reported to the PLD fabrication facility so that process engineers can focus on improving the layers likely responsible for the failures.

Tests circuits include more than just interconnect resources from a single layer, and a test circuit may fail due to defects in any of a number of constituent components. The mere fact of a test circuit's failure is therefore not necessarily conclusive of the layer in which a defect occurs. To make matters worse, design software that translates user-defined test circuits into circuit designs instantiated on PLDs "autoroutes" signal paths in a manner that favors routes with the shortest amount of delay. Conventional test circuits thus favor relatively short interconnect resources over long ones. It can be difficult, therefore, to develop a valid statistical model for identifying defects associated with metal layers that include relatively long interconnect resources. Also problematic, defects in any layer are relatively rare, as a percentage, even in unacceptably defective layers. The vast majority of circuits that employ a given interconnect layer will not include a defective interconnect resource. It is therefore difficult to create statistically valid failure models for all the various metal layers using failure data collected using conventional test circuits.

Test circuits in accordance with some embodiments intentionally employ slow, inefficient circuit paths in order to include a large proportion of interconnect resources selected from a particular metal layer. Assume, for example, that a test circuit, if autorouted, would employ a signal path made up of a pair of hex lines from metal layer 3 and a pair of single lines from metal layer 1. A failure of this signal path might be due to failures in either of metal layers 1 or 3. In accordance with some embodiments, the same signal path is manually rerouted to include a disproportionately large percentage of resources from one metal layer. For example, the signal path could be routed via a pair of single lines and eight hex lines. A failure of this signal path might still be due to a failure in metal layer 1, but is more likely due to a failure in metal layer 3.

Collections of test circuits, each weighted in favor of a specific metal layer, provide failure data that supports statistically valid failure models for the various metal layers. Hundreds of such test circuits can be exercised on each PLD subjected to production testing, and the resulting data can be collected and analyzed to identify weak points in the PLD manufacturing process. Test engineers might use the data to conclude, for example, that interconnect resources in one of six metal layers are 40% more likely to fail than other interconnect resources, and this information can be used to focus the attention of process engineers on the source of the problem.

Figure 2:
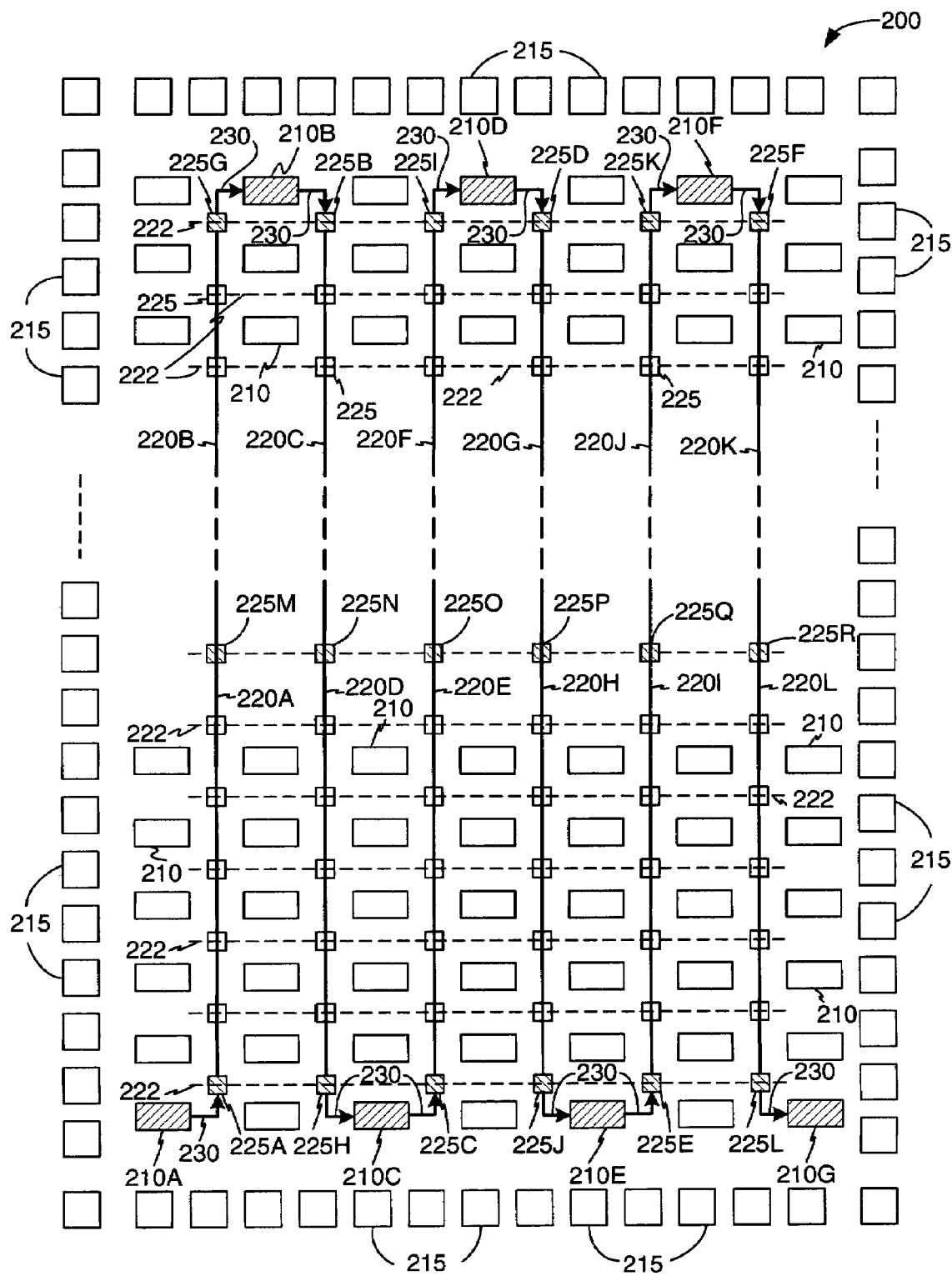
FIG. 2 depicts a conventional programmable logic device (PLD) 200 configured to employ the method of flowchart 100 of FIG. 1.

FIG. 2 depicts a conventional programmable logic device (PLD) 200 configured to employ the method of flowchart 100 of FIG. 1. In this example, PLD 200 is assumed to be one selected from the Virtex™ family of field-programmable logic devices commercially available from Xilinx, Inc., of San Jose Calif., though the invention is in no way limited to this particular architecture.

PLD 200 includes an array of configurable logic blocks (CLBs) 210 and programmable interconnect resources surrounded by a ring of programmable input/output blocks (IOBs) 215. The programmable interconnect resources include vertical and horizontal interconnect lines 220 and 222, programmable interconnect points (PIPs) 225, and configuration memory cells (not shown). Each CLB 210 and IOB 215 also includes configuration memory cells. The contents of the configuration memory cells determine how CLBs 210, the programmable interconnect resources, and IOBs 215 are configured.

Short conductors (not shown) connect neighboring components in PLD 200. Longer conductors, conventionally called "interconnect lines" or "interconnects," programmably connect components spaced farther apart. In the example of FIG. 2, vertical interconnects 220A–L (generically, interconnects 220) extend in a first metal layer and horizontal interconnects 222 extend in a second metal layer. An insulating layer separates the metal layers, with interconnect lines in different layers making contact through "vias" (not shown) that extend through the inter-layer insulation. Active circuits, such as transistors, are formed in a semiconductor substrate. Relatively short conductors are included in overlying first, second, and third metal layers, and relatively long conductors are formed in fourth and fifth metal layers overlying the first, second, and third metal layers.

As an example, in an architecture specific to Virtex™ FPGAs, interconnect lines that extend the length of six CLBs are referred to as "hex" lines. Programmable interconnect points (PIPs) selectively connect the hex lines to one another and to other interconnect lines to form desired signal paths. Conventional signal paths are autorouted to minimize delay, so autorouted test circuits typically include relatively few hex lines. Furthermore, Virtex™ FPGAs include still longer lines, referred to as "long lines," which are used for relatively long signal paths in lieu of chains of hex lines. Conventional place-and-route tools for instantiating circuits on PLDs attempt to optimize routing speed and efficiency, and so do not automatically interconnect components in the manner depicted in FIG. 2. Test circuits in accordance with this embodiment are therefore manually routed.

To localize interconnect defects in PLD 200, test circuits of the type discussed above in connection with FIG. 1 are instantiated into PLD 200. In the example of FIG. 2, the test circuit includes CLBs 210A–G (highlighted by cross-hatching) connected in series using interconnect resources disproportionately weighted in favor of hex lines 220. The interconnect lines employed in the test circuit are highlighted using relatively bold lines.

As noted above, hex lines 220 extend past six CLBs 210. CLB 210A connects to CLB 210B using a pair of hex lines 220A and 220B interconnected with one another and CLBs 210A and 210B via a number of PIPs, generically shown to as PIPS 225 (and including, in this example, PIPs 225A, 225M, and 225G). Dashed lines between hex lines 220A and 220B substitute for a chain of hex lines and PIPs (not shown). As with the CLBs, the PIPs employed in the test circuit are cross-hatched for ease of illustration. The remaining cross-hatched CLBs 210C–G are similarly connected in series using hex lines 220C–L. Because hex lines 220 extend vertically, relatively short conductors 230 connect the hex lines to the input and output terminals of CLBs 210. This example shows only two hex lines in each vertical chain for ease of illustration: practical PLDs have many more CLBs than in the example depicted, and the vertical hex-line chains can include far more than two hex lines.

During operation, CLB 210A through 210F transmit test signals to the associated downstream CLB via the intervening hex lines 220 and conductors 230. Data received in CLBs 210B–G are then compared with the expected data to identify failing signal paths.

Figure 3:
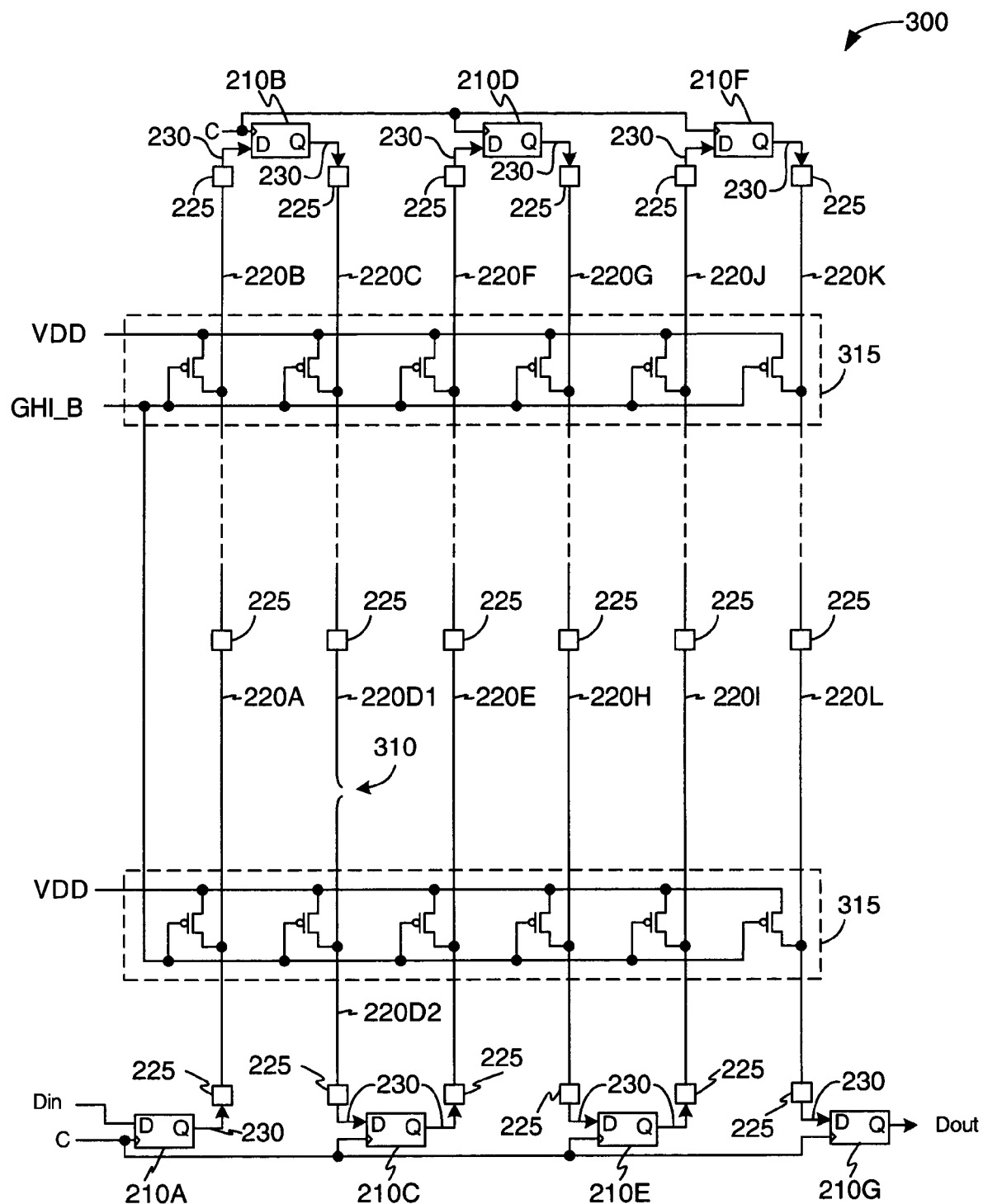
FIG. 3 depicts a test circuit 300 for localizing open defects.

FIG. 3 depicts a test circuit 300 for localizing open defects, and is functionally similar to the test circuit described above in connection with FIG. 2, like-numbered elements being the same or similar. Test circuit 300 includes a number of CLBs 210A–G, each configured as a simple register. These registers are connected in a chain using a number of hex lines 220A–L, other interconnect lines 230, and a collection of PIPs 225. Each one of hex lines 220 spans six configurable logic blocks, as discussed with respect to FIG. 2.

To illustrate the process of localizing a defect, an exemplary open defect 310 is inserted into FIG. 3, separating one of the hex lines in test circuit 300 into hex-line segments 220D1 and 220D2. As is conventional in Virtek™ FPGAs, a set of PMOS transistors 315 connects the interconnect lines, including hex lines 220A–L and lines 230, to a supply voltage VDD in response to a global control signal GHI_B (the AB@ is for Abar,@ and identifies the signal as an active low). When asserted, line GHI_B pulls each interconnect line and each interconnect driver (not shown) to a voltage level representative of a logic one. The interconnect is thus disabled during the configuration process to avoid data contention that might otherwise occur between interconnect lines.

Test circuit 300 can indicate the presence of defect 310 by presetting CLBs 210A–210G to known logic levels and then shifting data through test circuit 300 (e.g., from data terminal Din to data terminal Dout). Open 310 disrupts the flow of data, and can therefore be detected by attempting to transfer data between CLBs and reading the results of the attempted transfers.

A method in accordance with one embodiment quickly and precisely locates open 310 by taking advantage of the fact that the interconnect resources, including the hex lines, are pulled high during device configuration. In that embodiment, test circuit 300 is initialized with CLBS 210A–210G set to logic zeroes. CLBs 210A–210G are then promptly clocked once by presenting a clock edge on clock terminals C. Because transistors 315 hold the hex lines high to disable the interconnect during device configuration, the hex lines are at a logic level representative of a logic one unless pulled low by an associated register. In test circuit 300, for example, each line connected to the output of an associated CLB 210 is pulled to a low voltage representative of a logic zero. However, because hex-line segment 220D2 is isolated from the output of CLB 210B by open defect 310, the input of CLB 210C remains high. CLB 210C will therefore be the only register containing a voltage level representative of a logic one after receipt of a clock edge on node C.

Conventional PLDs support "readback" functionality that allows test engineers to read the contents of CLBs 210A–210G. In this example, a readback shows each CLB register in test circuit 300 to include a logic zero, with the exception of the register of CLB 210C. This pattern indicates the presence of open defect 310 somewhere in the data path extending between CLBs 210B and 210C. That data path consists principally of hex lines, so the failure mechanism likely relates to the metal layer in which the hex lines are formed.

Figure 4:
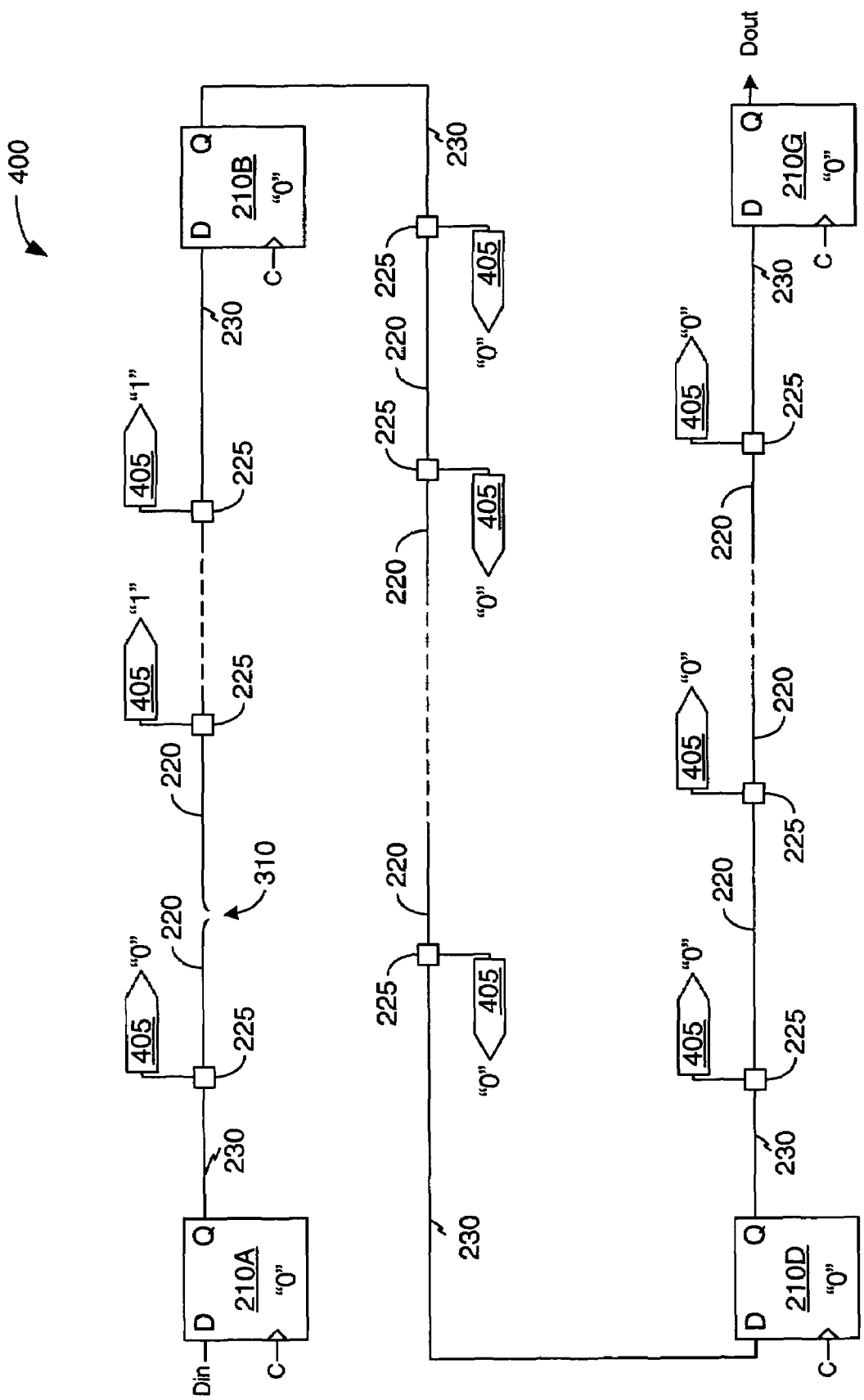
FIG. 4 depicts a test circuit 400 similar to test circuit 300 but modified to include additional configurable resources.

FIG. 4 depicts a test circuit 400 similar to test circuit 300 but modified to include additional configurable resources to better localize defect 310. Some or all of the PIPs 225 used to interconnect CLBs 210A–210G connect to respective output pads 405 via programmable input/output blocks (not shown). Pads 405 probe various portions of the interconnect resources extending between CLB 210A and 210G. Most of the interconnect lines of test circuit 400 are hex lines 220, though most of those are depicted as dashed lines for ease of illustration. Most CLBs 210 are also omitted for ease of illustration.

The exemplary open defect 310 is included to illustrate how test circuit 400 can be employed to localize open defects. As described in connection with FIG. 3, a PLD under test is configured to include test circuit 400. During configuration, the registers associated with CLBs 210A–210G are each preset to a voltage level representative of a logic zero. Also during configuration, each interconnect line and associated buffer (not shown), including hex lines 220, are raised to a voltage level representative of a logic one to disable the interconnect. CLBs 210A–210G are then clocked once so that each register captures the logic level expressed on the respective data input. In the example, open defect 310 prevents the logic zero expressed by CLB 210A from reaching downstream components. As a consequence, the register in CLB 210B and similar register (not shown) in the IOBs associated with those pads 405 between defect 310 and CLB 210B capture the voltage level established during the interconnect-disable step of the configuration process. Assuming no other defects, the remaining pads and registers exhibit logic zeros. The combined data from the pads and registers can then be examined to locate open defect 310 in the hex line 220 extending between the first two pads 405.

Figure 5:
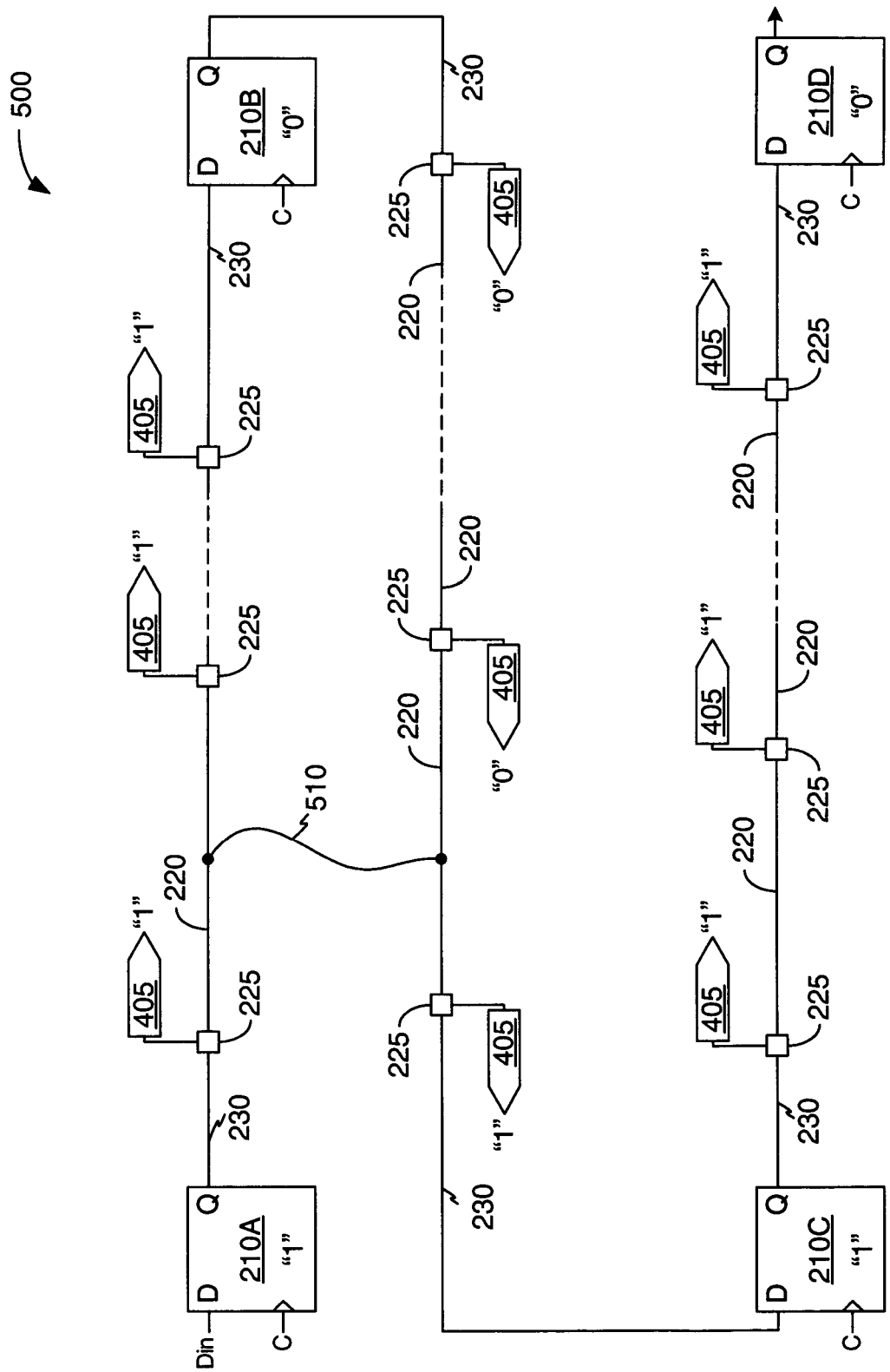
FIG. 5 depicts a test circuit 500 used in accordance with one embodiment to localize bridge defects.

FIG. 5 depicts a test circuit 500 used in accordance with one embodiment to localize bridge defects, an exemplary one of which is shown as a short defect 510 extending between two hex lines 220. Test circuit 500 is similar to test circuits 300 and 400 of FIGS. 3 and 4, like-numbered elements being the same or similar.

During device configuration, CLBs 210A and 210C are preset to logic one and CLBs 210B and 210C are preset to logic zero. All of CLBs 210A–210D are then clocked. In the absence of defects, the data in each register shifts to the next in the series, such that CLBs 210B and 210D store values representative of the logic one and CLB 210C stores a value representative of a logic zero. Due to bridge defect 510, and assuming a voltage representative of a logic one on interconnect lines 220 overpowers a voltage representative of a logic zero, the value in CLB 210A shifts into both of CLBs 210B and 210C. The test can be repeated with opposite stored logic levels in case a voltage representative of a logic zero on interconnect lines 220 overpowers a voltage representative of a logic one.

Though not shown, hex lines 220 conventionally include drive amplifiers (drivers) that move data in a desired direction based on the configuration. Pads 405 connected to PIPs 225 between defect 510 and the output of CLB 210B are therefore established by the output of CLB 210B, while the one of pads 405 between defect 510 and the input of CLB 210C is driven by the output of CLB 210A. Pads 405 and the contents of CLBs 210A–210D thus provide a signature indicating the location of defect 510.

While the present invention has been described in connection with specific embodiments, variations of these embodiments will be obvious to those of ordinary skill in the art. For example, while illustrated with respect to an FPGA architecture, the test procedures discussed herein are equally applicable to other types of PLDs. In general, high-density PLD architectures include a number of configurable logic blocks and some programmable interconnect resources. Configurable logic blocks have many forms and many names, such as CLBs, logic blocks, logic array blocks, macrocells, logic cells, and functional blocks. Programmable routing resources also have many forms and many names. Therefore, the spirit and scope of the appended claims should not be limited to the foregoing description.

What is claimed is:

1. A method of monitoring a manufacturing process for a plurality of programmable logic devices (PLDs) of a PLD type, each of the PLDs including a first collection of interconnect resources occupying a first conductive layer and a second collection of interconnect resources occupying a second conductive layer, the method comprising:

for each of the PLDs:
instantiating a number of test circuits on the PLD, the test circuits including test-circuit interconnect resources selected from the first and second collections of interconnect resources;
activating the test circuits to pass signals through the test-circuit interconnect resources;
monitoring the activated test circuits to identify failed test circuits; and
for each of the failed test circuits, storing data representative of the test-circuit interconnect resources of the failed test circuit, the data differentiating the test-circuit interconnect resources selected from the first collection of interconnect resources from the test-circuit interconnect resources selected from the second collection of interconnect resources; and
calculating the probability of failures in the first conductive layer using the stored data of a plurality of the failed test circuits identified during the monitoring of the activated test circuits.

2. The method of claim 1, wherein the first collection of interconnect resources includes a first plurality of interconnect lines, wherein the second collection of interconnect resources includes a second plurality of interconnect lines, each of the second plurality of interconnect lines being at least twice as long as each of the first plurality of interconnect lines, and wherein at least one of the test circuits includes more than twice as many of the second plurality of interconnect lines as the first plurality of interconnect lines.

3. The method of claim 2, wherein each PLD includes an array of logic blocks, and wherein each of the second plurality of interconnect lines extends along six of the logic blocks.

4. The method of claim 1, wherein calculating the probability of failures in the first conductive layer comprises comparing, from the data stored in connection with the failed test circuits, a first number of the test-circuit interconnect resources selected from the first collection of interconnect resources with a second number of the test-circuit interconnect resources selected from the second collection of interconnect resources.

5. The method of claim 1, further comprising calculating the probability of failures in the second conductive layer using the stored data of the plurality of the failed test circuits identified during the monitoring of the activated test circuits.

6. The method of claim 1, further comprising modifying the manufacturing process in response to the calculated probability.

7. A test method for a programmable logic device, the programmable logic device including an array of configurable logic blocks, a first collection of interconnect lines each extending a first length in a conductive layer, and a second collection of interconnect lines each extending a second length less than half the first length, the method comprising:

programmably connecting a first of the configurable logic blocks to a second of the configurable logic blocks via a signal path, the signal path including a first number of the first collection of interconnect lines and a second number of the second collection of interconnect lines, wherein the first number is at least twice the second number;

conveying a signal from the first of the configurable logic blocks to the second of the configurable logic blocks via the signal path;

monitoring the signal at a plurality of points along the signal path; and calculating probability of failures in the conductive layer based at least in part on the monitoring the signal.

8. The test method of claim 7, further comprising, before conveying the signal, setting the signal path to a first voltage representative of a first logic level and presetting the first configurable logic block to a second voltage representative of a second logic level.

9. The test method of claim 8, further comprising, before conveying the signal, presetting the second configurable logic block to the first voltage.

10. The test method of claim 8, further comprising, before conveying the signal, presetting the second configurable logic block to the second voltage.

11. The test method of claim 7, wherein some of the second collection of interconnect lines extend in a second conductive layer and others of the second collection of interconnect lines extend in a third conductive layer.

12. The test method of claim 7, wherein the programmable logic device includes a row of configurable logic blocks, and wherein six consecutive configurable logic blocks in the row extend a distance of about the first length.

* * * * *